US006233130B1

(12) United States Patent
Lin (10) Patent No.: US 6,233,130 B1
(45) Date of Patent: May 15, 2001

(54) ESD PROTECTION DEVICE INTEGRATED WITH SCR

(75) Inventor: Shi-Tron Lin, Hsinchu (TW)

(73) Assignee: Winbond Electronics Corp., Hsinchi (TW)

(*) Notice: Subject to any disclaimer, the term of this patent is extended or adjusted under 35 U.S.C. 154(b) by 0 days.

(21) Appl. No.: 09/126,200

(22) Filed: Jul. 30, 1998

(51) Int. Cl.⁷ ....................................... H02H 9/00
(52) U.S. Cl. .................. 361/118; 361/56; 361/91.1; 361/111
(58) Field of Search ................... 361/118, 911, 361/56, 58, 113, 127, 100, 111

(56) References Cited

U.S. PATENT DOCUMENTS 5,400,202 * 3/1995 Metz et al. ........................ 361/56

\* cited by examiner

Primary Examiner—Stephen W. Jackson
(74) Attorney, Agent, or Firm—Fulbright & Jaworski L.L.P.

(57) ABSTRACT

A transient voltage-pump circuit pumps the ESD voltage to a higher voltage. The pumped-high transient voltage is used for early triggering of an SCR. In one version of the present invention, a pn junction of the SCR device is used as part of the voltage-pump circuit. This saves the layout area while improving the ESD performance. The present invention improves the ESD performance of an SCR ESD protection circuit which is used for protecting the power bus or an IC pin during an ESD event.

39 Claims, 9 Drawing Sheets

ESD PROTECTION DEVICE INTEGRATED WITH SCR

FIELD OF INVENTION

The invention relates to an ESD protection device employing the SCR.

BACKGROUND OF THE INVENTION

In a Human-Body-Model ESD transient, an 100 PF capacitor is first charged up to an ESD zapping voltage, and then discharges through a 1.5 kohms resistor onto an IC pin. For instance, a zapping voltage level of 2 KV is used to qualify an IC package. The initial peak current is roughly 1.2 A with a rise time of approximately 10 nsec. For integrated circuit packages, the VDD-to-VSS capacitance is typically larger than 1 nF. If the ESD energy is directly absorbed by the power bus, i.e. for ESD stress of VDD pin to VSS pin, or indirectly absorbed by the power bus, i.e. the positive ESD stress on an input or I/O pin that has a pull up device, then the voltage-rising rate inside an IC may reach 1 to 2 volt per nano-second for a Human-Body-Model ESD zapping at 2 to 3 KV level. The pull up device includes p+/nwell diode or PMOSFET.

Transistors, such as grounded-gate NMOS(GGNMOS), field-oxide MOSFET, output buffer transistors, or bipolar transistors, have been commonly used as primary ESD protection elements for integrated circuits. A Semiconductor Controlled Rectifier (SCR), typically including pnpn junctions, can also be used as primary ESD protection device for protecting an IC pin or a power bus during an ESD event. "ESD in Silicon Integrated Circuits" by A. Amerasekera and C. Duvvury, Chap. 3 and 4, John Wiley & Sons, 1995, provides a basic introduction for an SCR used as an ESD protection device.

Figure 1A:
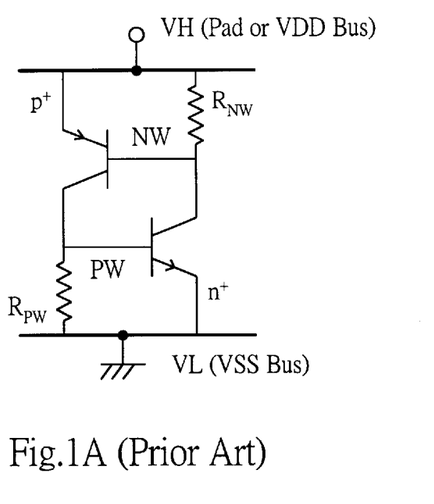
FIG. 1A and FIG. 1B show an SCR structure and FIG. 1C shows the cross section view of SCR.
Figure 1B:
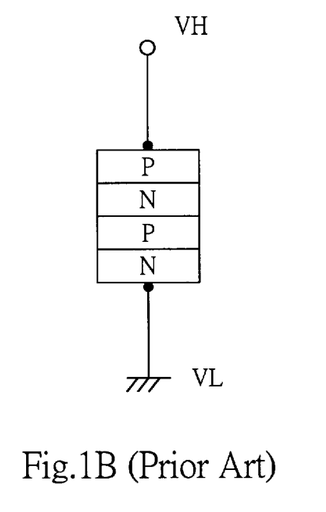
Figure 1C:
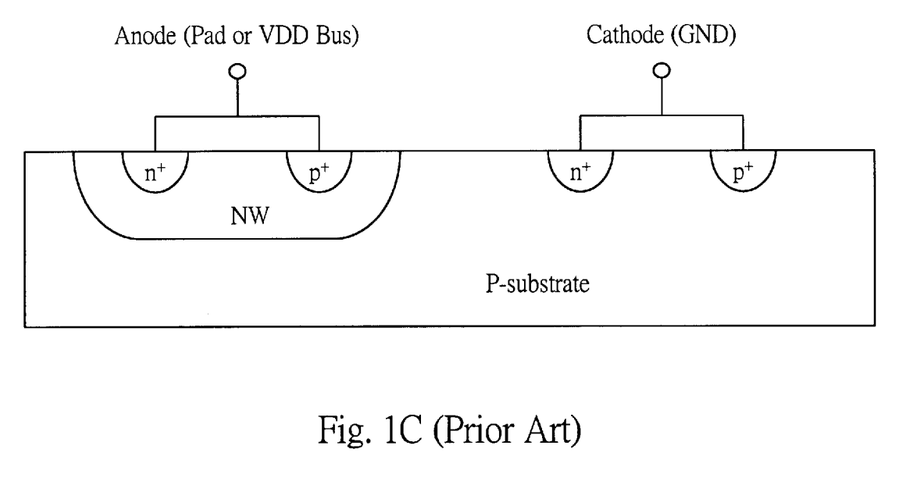

FIGS. 1A, 1B and 1C Shows the basic structure of an SCR. The anode of an SCR can be connected to an IC pin, while the cathode of the SCR can be connected to ground, for ESD protection of an IC pin. Alternatively, the anode can be connected to VDD bus to prevent the internal circuit from being damaged during an ESD event from the power bus. The conventional SCR is triggered by the nwell to p-substrate junction breakdown, which is relatively high, for instance, typically >20V. This is a drawback when an SCR is used as an ESD protection element since it may not trigger sooner enough during an ESD event to protect other circuit elements from ESD damages.

Figure 2A:
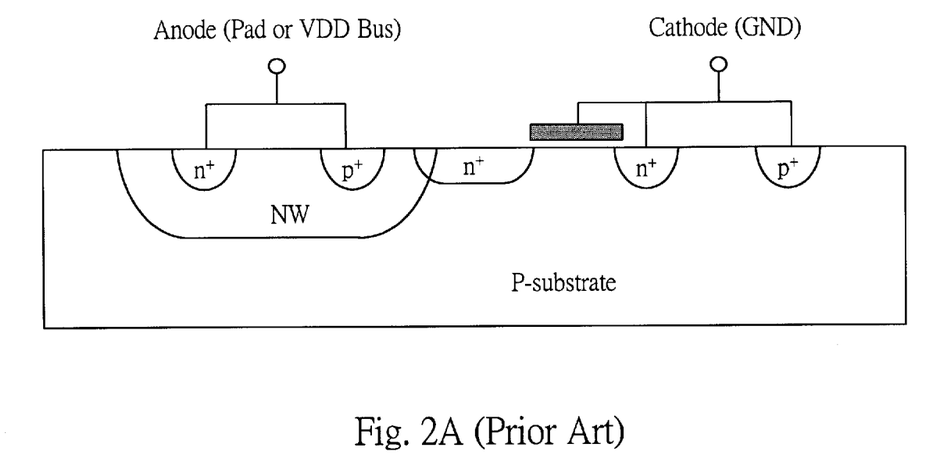
FIG. 2A shows the low voltage triggerinf SCR in accordance with U.S. Pat. No. 5,465,189.
Figure 2B:
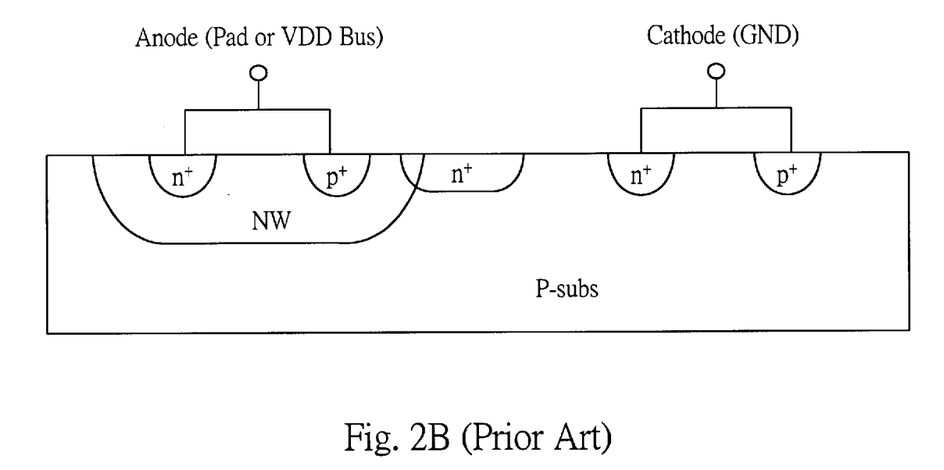
FIG. 2B shows the variation of FIG. 2B by utilizing integrated lateral bipolar device instead of MOSFET to trigger the SCR.

U.S. Pat. No. 5,465,189 describes an SCR used to provide on-chip protection against ESD stress applied at the input, output, power-supply bus, or between any arbitrary pair of pins of an integrated circuit. A novel structure in the patent having a low breakdown voltage is incorporated into the SCR to lower the trigger voltage of the SCR. FIG. 2A shows the low-voltage trigger SCR, according to U.S. Pat. No. 5,465,189, which integrates an NMOSFET with the SCR, such that the trigger voltage of the SCR is equal to the trigger voltage of an NMOSFET, which is typically roughly at or lower than 12 volts. FIG. 2B shows a variation of FIG. 2A in which an integrated lateral bipolar device, instead of NMOSFET, is provided to reduce the trigger voltage of an SCR.

Figure 3:
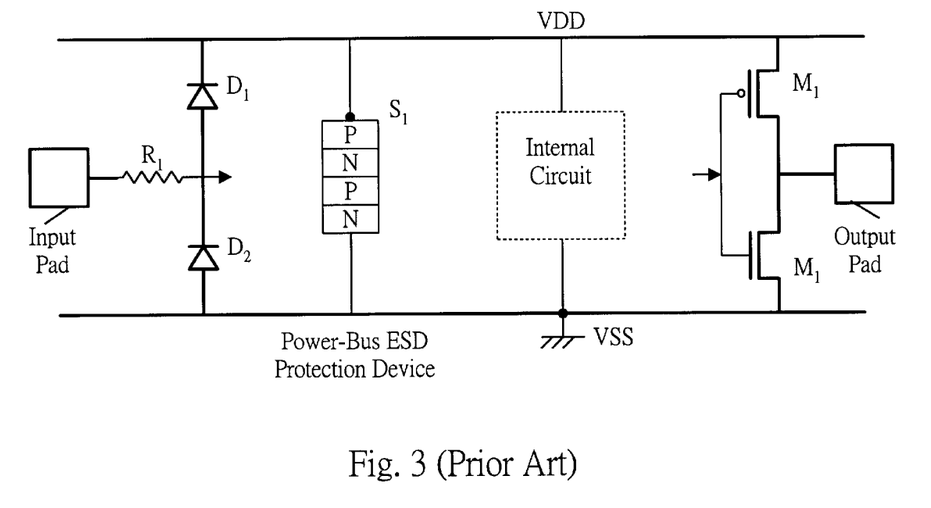
FIG. 3 shows a complete ESD protection scheme in accordance with the prior arts.

FIG. 3 shows an example of full-chip ESD protection scheme. The ESD protection of the input pin consists of a resistor R1, a diode D1 pull-up device, a diode D2 pull-down device. The ESD protection of an output pin relies on the output buffer, e.g. pull-up PMOS and pull-down NMOS, for self protection during an ESD event. Also shown in FIG. 3, the VDD bus potential can be pulled high through a pull-up p+/nwell diode or a pull-up PMOS. And similarly, the VSS bus potential can be pulled low through a pull-down n+/pwell diode or a pull-down NMOS. Therefore, the VDD to VSS voltage difference can be rapidly higher than 10 volt during an ESD events including the following situations: (i) positive stress of VDD pin to VSS pin, (ii) negative stress of VSS pin to VDD pin, (iii) positive stress on an input or I/O pin while the pin is connected to a pull-up (p+nwell) diode or a pull-up PMOS, or (iv) negative stress on an input or I/O pin while the pin is connected to a pull-down (n+/pwell) diode or a pull-down NMOS. Therefore, it is a common practice to include ESD protection elements, such as an SCR device SI, between VDD and VSS bus to protect the power bus and the internal circuit from being damaged during an ESD event.

It is of great advantage to lower the trigger voltage of an ESD protection device during an ESD event. As the ESD protection functions sooner, and the transient voltage imposed on the I/O and internal circuit can be lower which provides a better overall ESD protection.

Figure 4A:
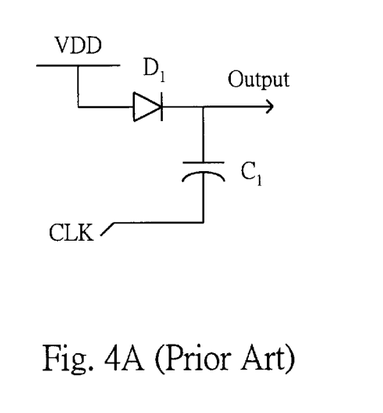
FIG. 4A and FIG. 4B respectively shows two prior art voltage pumps.
Figure 4B:
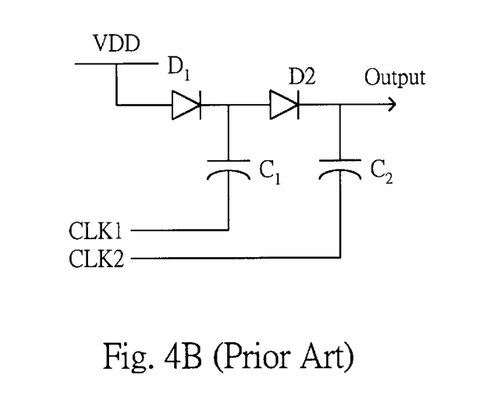

FIGS. 4A and 4B describe prior-art methods of voltage-pumping which generates a train of high voltage pulses with voltages higher than VDD during circuit operation. As shown in FIGS. 4A and 4B, a voltage-pump circuit typically comprises at least one pn junction diode D1, for clamping the output voltage not to be lower than (VDD-0.8) volts, such that a rising-edge clock signal can pump the output voltage higher than VDD. The capacitor C1 acts as a capacitive coupling device in FIG. 4A. FIG. 4B discloses two stages of voltage pumping.

SUMMARY OF INVENTION

An electrostatic discharge (ESD) protection structure for an integrated circuit constructed on a substrate of a first type is provided.

The protection structure includes a semiconductor controlled rectifier (SCR) and a transient voltage pumping circuit.

The semiconductor controlled rectifier (SCR) is constructed on the substrate and coupled to the integrated circuit and the SCR includes a first region of a second type formed within the substrate.

The transient voltage pumping circuit is coupled to the first region and the transient voltage pumping circuit pumps the ESD voltage to a higher voltage during the ESD transient for earlier triggering the SCR during the ESD event.

BRIEF DESCRIPTION OF THE APPENDED DRAWINGS

FIG. 5 shows the invention.

DESCRIPTION OF THE PREFERRED EMBODIMENTS

Figure 5:
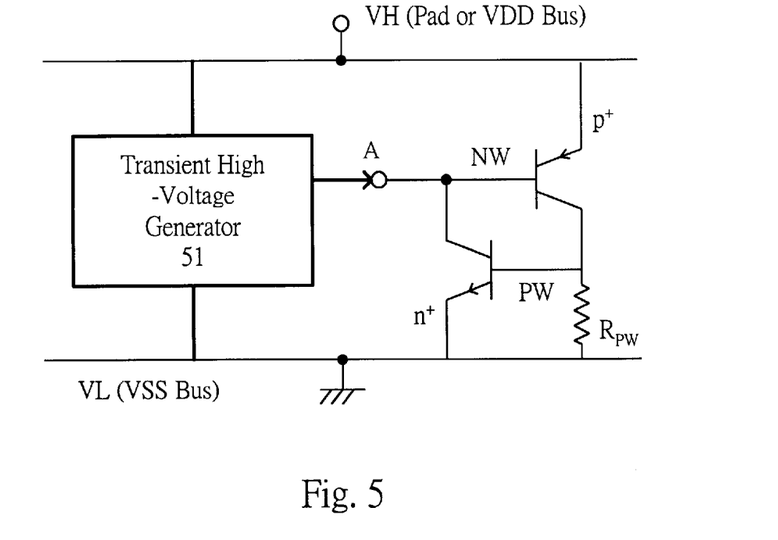

Referring to FIG. 5, the invention has a transient high-voltage pumping circuit 51 for pumping the ESD voltage to a higher voltage during the ESD transient. The pumped high voltage is applied to the SCR for early trigger of an SCR during an ESD event. FIG. 5 shows the output of the transient high-voltage pumping circuit 51 is connceted to the nwell of an SCR, such that the nwell to pwell (or p-substrate) junction can be breakdown sooner at an earlier ESD transient. The SCR is constructed on a base region and coupled to the integrated circuit. The SCR includes a first region of a second type formed next to the base region, a second region of the first type formed in the first region, and a third region of the second type formed in the base region. In particular, the voltage transition has ramp rate faster than the ESD transient voltage's ramp rate.

In a preferred embodiment, the first type is P type and the second type is n type.

As shown, the second region is coupled to a first bus electrically coupled to an ESD transient voltage source. And the first bus is a power bus.

Not shown in FIG. 5, a diode may be disposed between the first bus and an IC pin receiving the ESD transient voltage similar to that shown in FIG. 3. In an embodiment, the diode is a junciton diode of a MOSFET.

In a preferred embodiment, the third region is coupled to a second bus which may be a ground bus.

In a preferred embodiment, the first region is an nwell, the second region is a p+diffusion in the nwell, the third region is an n+ diffusion in the base region, and the base region is of p type.

In another embodiment, the first region is a pwell, the second region is an n+diffusion in the pwell, the third region is a p+ diffusion in the base region, and the base region is of n type.

In another embodiment, the first region is a first well of the second type, and the base region is a substrate.

In another embodiment, the first region is a first well of the second type, the base region is a second well of the first type, and the first well is within the second well. In an embodiment, the second well is constructed on a substrate of the integrated circuit. In alternative embodiment, the substrate is of the second type.

In a preferred embodiment, the base region is the substrate of the integrated circuit.

In a preferred embodiment, the first region is formed within the base region.

In a preferred embodiment, the transient high-voltage puming circuit includes a voltage transition circuit for generating at least a voltage transition during the ESD event. Alternatively, the transient high-voltage puming circuit includes a voltage transition circuit for generating at least a voltage-rising transition during the ESD event As recited, the voltage transiton has a ramp rate faster than the ESD transition voltage's ramp rate.

Figure 6A:
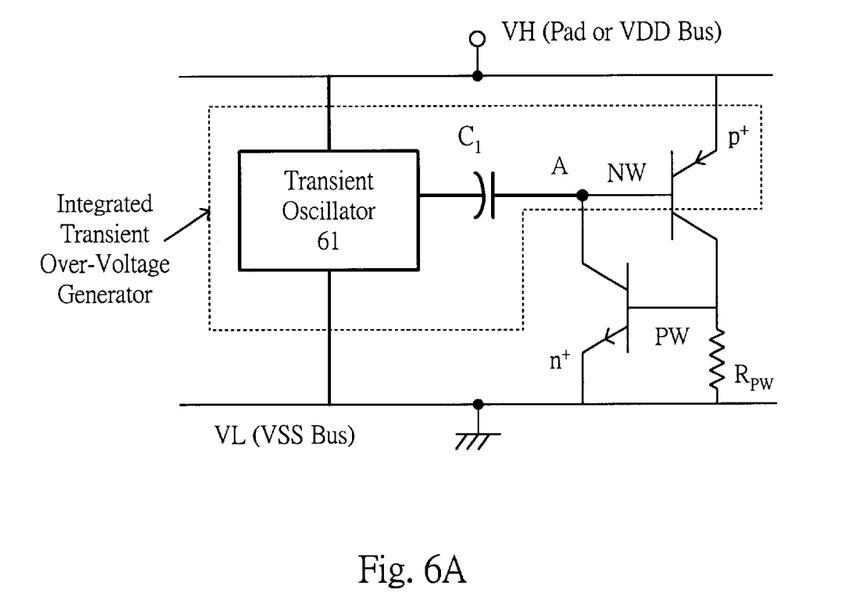
FIG. 6A shows embodiment of the invention.

Referring to FIG. 6A, the embodiment of the transient high-voltage pumping circuit includes an oscillator circuit 61 for generating fast clocks during the ESD transient. By incorporating with a capacitor C1 and the p+/nwell junction diode of an SCR structure, it forms an integrated voltage-pump circuit for generating a voltage higher than the ESD transient voltage during the initial phase of an ESD event. The pumped high voltage directly applies to the nwell of the SCR structure such that the SCR triggering occurs sooner during an ESD event. Also, the voltage transition of the fast clocks has a ramp rate faster than the ESD transient voltage's ramp rate. It is clear from FIG. 6A that a diode is formed by the first region (nwell) and the second region (P+) and the first region couples to the capacitor C1. As shown, the second region is coupled to a power bus. The third region (n+) is coupled to a ground bus.

Figure 6B:
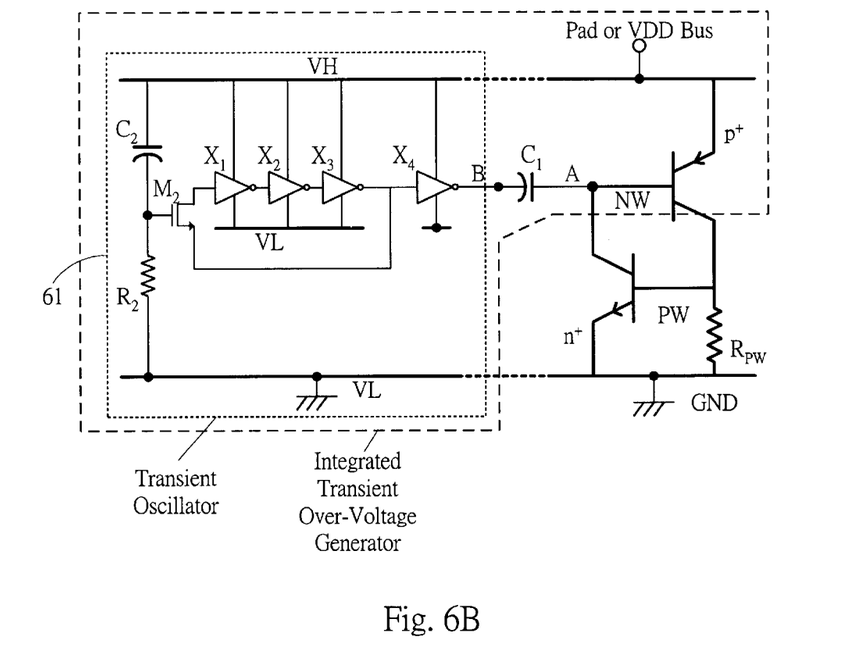
FIG. 6B shows details of the transient oscillator in FIG. 6A.
Figure 11:
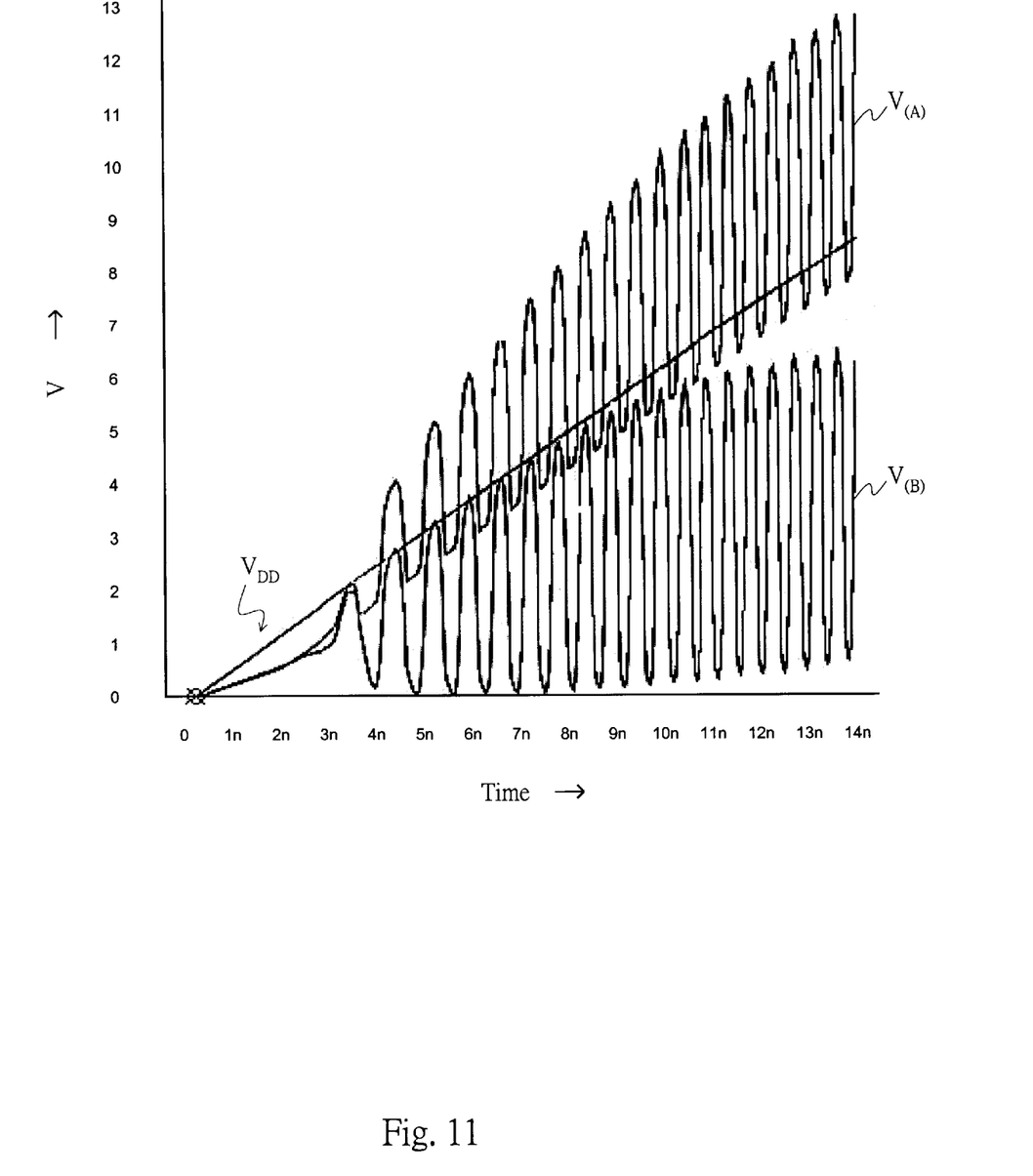
FIG. 11 shows the simulation result of the voltages at node A and B shown in FIG. 10B.

FIG. 6B shows details of the transient oscillator 61, in accordance with the preferred embodiment, together with the SCR structure. The transient oscillator 61 is emploed for generating fast clocks with increasing oscillation amplitude during the initial phase of an ESD transient. As shown in FIG. 6B, the oscillator 61 is formed by a serial connection of an odd number of (at least one) voltage inverting gates. In a preferred embodiment, the voltage inverting gate is an inverter. The VH of the oscillator 61 is electrically coupled to the VDD bus, or alternatively, electrically coupled to an IC pin via a pull-up device. The VL is electrically coupled to VSS. An optional buffer means (X4) can be used to improve the drive strength of the oscillating signal at node B. During a positive VDD-to-VSS or pin-to-VSS ESD event, the voltage difference of the VH and VL of the oscillator increases rapidly along with the transient ESD voltage. As a consequence, as shown in FIG. 11, the amplitude of the oscillating signal V(B) at node B also increases rapidly during the initial ESD transient, for instance, during the initial 10 ns of a Human-Body-Model ESD event.

Through a p+/nwell diode and a coupling capacitor C1, with the electrical connections shown in FIG. 6B, the node A serves to provide a transient voltage higher than the ESD transient voltage (VH). During the voltage decreasing cycle of V(B), V(A) is kept at no less than VH-0.8V through forward-biasing of the p+/nwell diode. During the voltage increasing cycle of V(B), V(A) can be pumped to VH-0.8 volts +V(B), which can reach a high limit of 2VH-0.8 v. As the transient ESD voltage VH still less than 10 volt, V(B) can reach 12 volt or higher for early trigger of a primary ESD protection device.

Also shown in FIG. 6B, an NMOSFET M2 is used as a transient switch. The gate of M2 is coupled to VH through a capacitor $C_2$, and coupled to VL through a resistor $R_2$. The R-C time constant is roughly 10 ns to 50 ns, which enables the oscillator circuit to oscillate for at least around 10 ns, but not much longer than that, during an ESD transient or power-up transient. On the other hand, since a powering-up event typically takes longer, or much longer, than microseconds, the gate of M2 remains at a much lower voltage than the threshold voltage required to turn on M2. Therefore, the oscillator circuit does not oscillates during normal IC operation or powering up.

Figure 6C:
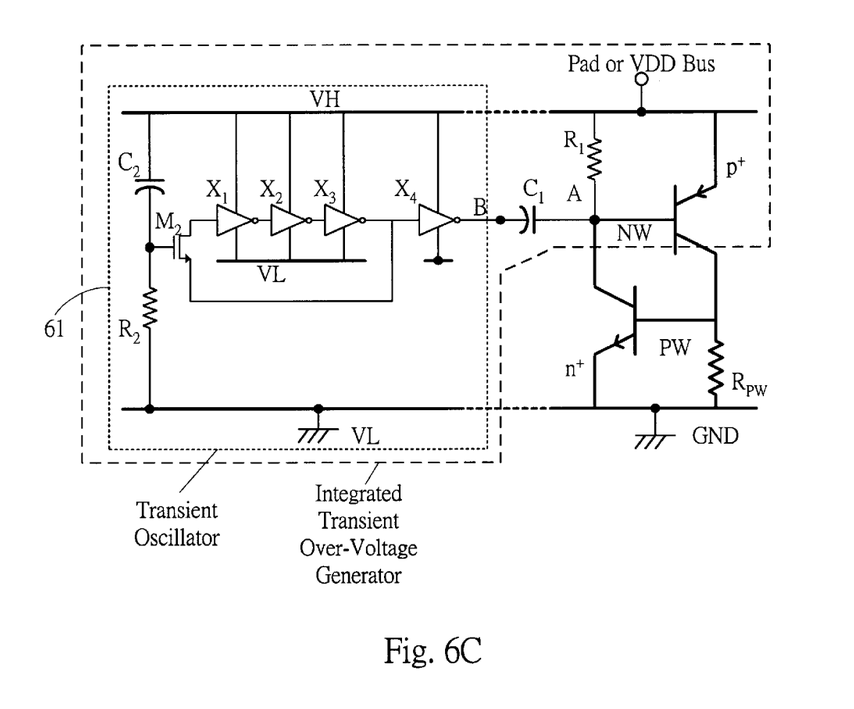
FIG. 6C shows one alternative of FIG. 6B.

FIG. 6C is a variation of FIG. 6B, where the nwell is electrically connected to the anode (pad or VDD) through a resistor R1. R1 includes the nwell resistance and the resistance of a series resistor. The time constant of R1 C1 is preferably larger than the voltage-rising phase of the ESD transient, for example R1C1>50 ns, such that the SCR is easy to trigger during an ESD event. R1C1 is also preferably less than the powering up transient, for example R1C1<1 µs, such that the SCR does not trigger during normal operation or powering up.

Figure 7:
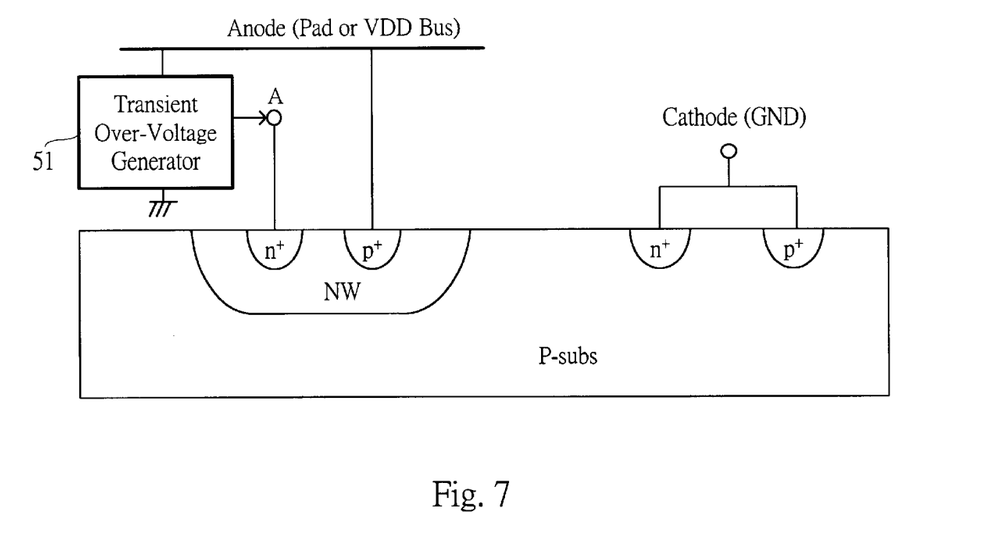
FIG. 7 shows section view of circuit in FIG. 5.

FIG. 7 shows the cross section of a conventional SCR structure with a transient high-voltage pumping circuit 51 applying the transient high voltage to n+diffusion within the nwell. The SCR will trigger as the transient high-voltage exceeds, while the ESD transient voltage is still lower than, the SCR trigger voltage.

Figure 8:
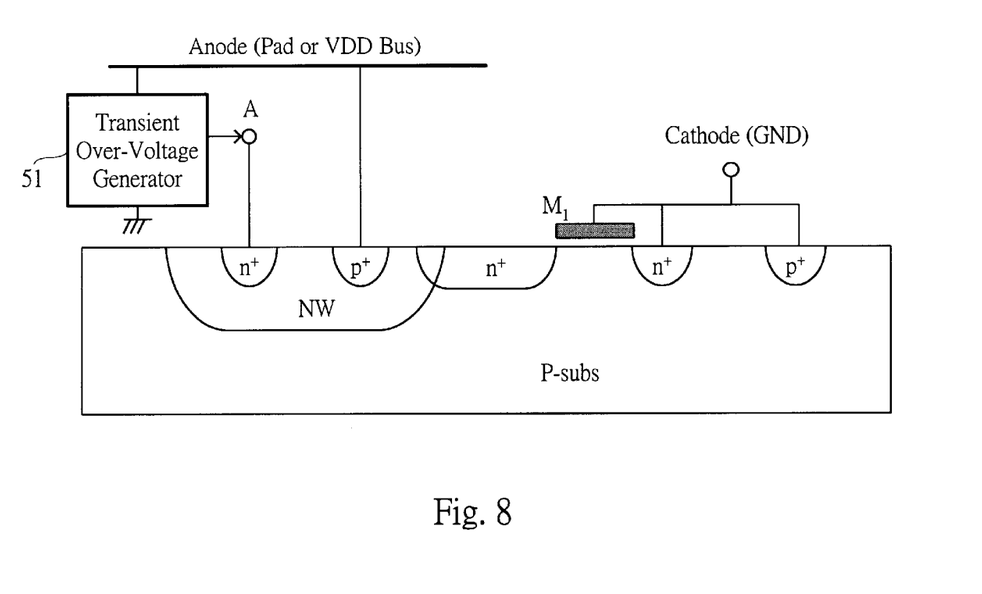
FIG. 8 shows section view of the invention when employing the teaching of U.S. Pat. No. 5,465,189.

FIG. 8 shows the cross section of an LVTSCR (Low-Voltage-Trigger SCR) structure with a transient high-voltage pumping circuit 51 applying the transient high voltage to the nwell through an n+diffusion in the nwell. Since the drain junction of a NMOSFET overlaps with the nwell, the SCR will trigger at the NMOSFET trigger voltage, which is roughly 12 volt. And this occurs when the ESD transient voltage is still less than 10 volt due to the voltage-pumping of the transient high-voltage pumping circuit 51.

Figure 9:
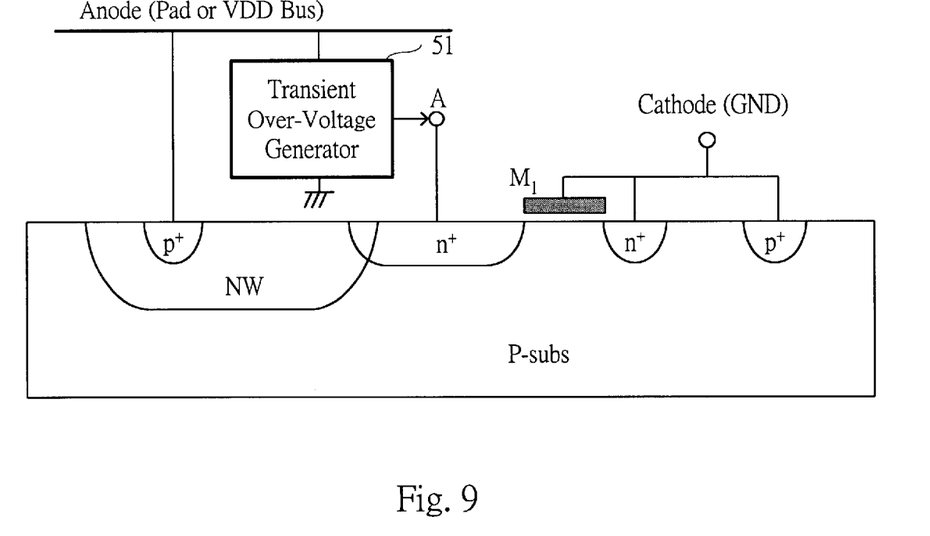
FIG. 9 shows a variation of FIG. 8.

FIG. 9, being a variation of FIG. 8, shows the output of the transient high-voltage pumping circuit 51 is connected to an n+diffusion junction, which is the drain of the NMOSFET M1 and overlaps with the nwell.

Figure 10A:
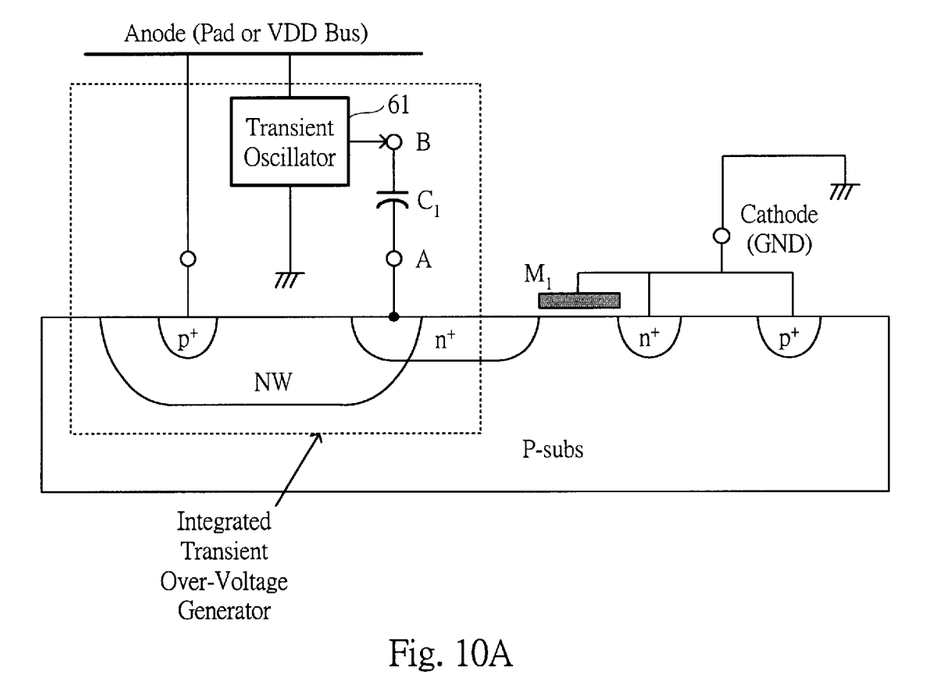
FIG. 10A shows another embodiment of the invention in sectional view.

FIG. 10A shows that the transient oscillator 61, connecting to a p+/nwell junction or the LVTSCR through a capacitor C1, forms an integrated transient high-voltage pumping circuit 51. One example of transient oscillator 61 is shown in FIG. 6B.

Figure 10B:
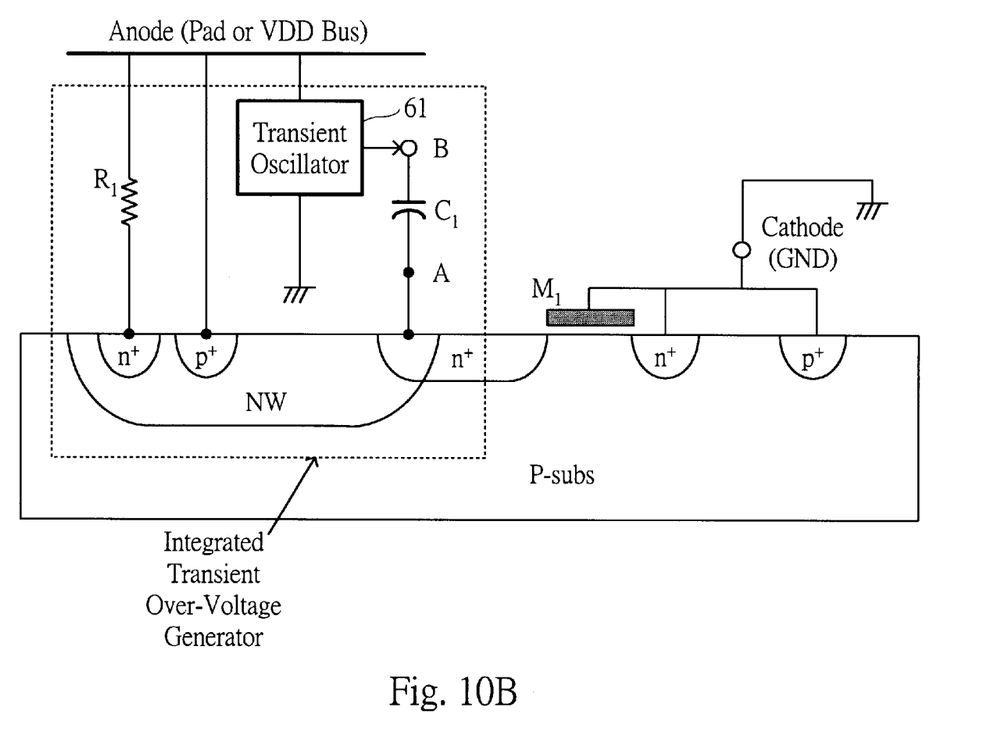
FIG. 10B shows still another embodiment of the invention in sectional view.

FIG. 10B shows a variation of the structure in FIG. 10A, with the nwell electrically connected to the anode of the SCR through a resistor R1. The resistance R1 includes the nwell resistance and any serially connected resistance.

FIG. 11 shows the transient ESD voltage applied to VDD and the transient-voltage waveforms of V(B) and V(A), where V(B) is the output of the transient oscillator 61, and V(A) is the output of the transient high-voltage pumping circuit 51. The simulation was based on 3 KV HBM (Human-Body-Model) and a 3 nF power bus (VDD to VSS) capacitance. As shown in the graph, V(A)>VDD during the initial phase of the ESD event. When V(A) is applied to the nwell of an LVTSCR as shown in FIG. 10, the LVTSCR can be triggered at, for example, 12 volt which depends on the process technology, while VDD is still at less than 8.5 volt. In other words, without the present invention, the LVTSCR can be triggered at approximately 12V. With the present invention, the LVTSCR can be triggered earlier when the ESD transient voltage is still less than 8.5 volt, thus providing earlier trigger of the LVTSCR and improved ESD protection for the internal circuits of the IC chip.

According to the present invention, the transient oscillator 61 functions to provide at least one voltage switching during the ESD transient to generate at least one transient high voltage pulse to trigger the SCR device. Therefore, it is apparent to persons skillful in the arts that the transient oscillator 61 described in this invention can be substituted by any other switching circuit capable of providing one or multiple voltage switchings during the initial ESD transient which triggers the SCR to conduct large amount of ESD current.

What is claimed is:

1. An electrostatic discharge (ESD) protection structure for an integrated circuit constructed on a base region of a first type, comprising:

a semiconductor controlled rectifier (SCR) constructed on the base region and coupled to said integrated circuit, said SCR including a first region of a second type formed next to said base region, a second region of the first type formed in the first region, and a third region of the second type formed in said base region;

a transient high voltage pumping circuit coupled to the first region, said transient high voltage pumping circuit pumping an ESD voltage to a second voltage applied to the first region during the ESD transient for earlier triggering of said SCR during the ESD event wherein said second voltage is higher than the ESD voltage.

2. The structure of claim 1, wherein the voltage pumping circuit comprises a voltage transition means for generating at least a voltage transition during the ESD event.

3. The structure of claim 1, wherein the voltage pumping circuit comprises a voltage transition means for generating at least a voltage-rising transition during the ESD event.

4. The structure of claim 2, wherein said voltage transition has a ramp rate faster than the ESD transient voltage's ramp rate.

5. The structure of claim 2, wherein the voltage pumping circuit further comprises a capacitor and a first diode, the capacitor couples the voltage transition means and the first diode.

6. The structure of claim 5, wherein the first diode couples the capacitor to an ESD transient voltage source.

7. The structure of claim 6, wherein the first diode couples the capacitor to a first bus which is electrically coupled to the ESD transient voltage source.

8. The structure of claim 7, wherein the first bus is a power bus.

9. The structure of claim 7, further comprising a second diode which couples said first bus to the ESD transient voltage source.

10. The structure of claim 9, wherein the second diode is a junction diode of a MOSFET.

11. The structure of claim 6, wherein said first diode is formed by the first region and the second region, and the first region couples to the said capacitor.

12. The structure of claim 11, wherein the second region couples to a power bus.

13. The structure of claim 11, wherein said third region couples to a ground bus.

14. The structure of claim 1, wherein a transient voltage of said second region rises in response to the ESD transient voltage, a transient voltage of said first region rises in response to the ESD transient voltage, the transient voltage of said first region is higher than the transient voltage of said second region.

15. The structure of claim 2, wherein the voltage transition means comprises an oscillation means having an output terminal for generating an oscillation signal during an ESD event.

16. The structure of claim 15, further comprising
a delay-switch means operative to turn on the oscillation means for at least a time period during the ESD event.

17. The structure of claim 15, wherein the oscillation means comprises:

N voltage inverting gates serially connected to each other, N is an odd number, the last of the N voltage inverting gates generates the oscillation signal at an output terminal thereof.

18. The structure of claim 17, wherein the delay-switch means comprises:

a switch means having an input node, an output node and a control node, wherein said input node connects to the output terminal of the last of N voltage inverting gates, said output node connects to an input terminal of the first of N voltage inverting gates;

a control signal generator for generating a control signal to said control node of the switch means to turn on the switch means for at least a time period during the ESD event.

19. The structure of claim 18, wherein said control signal keeps said switch means off during normal operation of the integrated circuit.

20. The structure of claim 18, wherein said control signal keeps said switch means off during power-on operation of the integrated circuit.

21. The structure of claim 18, wherein said control signal generator includes an RC circuit having a resistor and a capacitor with one common joint terminal generating the control signal.

22. The structure of claim 18, wherein said switch means is a MOSFET transistor, and said control node is a gate of the MOSFET transistor.

23. An electrostatic discharge (ESD) protection structure for an integrated circuit constructed on a base region of a first type, comprising:

a semiconductor controlled rectifier (SCR) constructed on the base region and coupled to said integrated circuit, said SCR including a first region of a second type formed next to said base region, a second region of the first type formed in said first region, and a third region of the second type formed in said base region;

a capacitor;

a voltage transition means responsive to an ESD transient voltage, for generating at least a voltage transition during the ESD event;

wherein the capacitor couples the first region and the voltage transition means for generating a second voltage applied to the first region during the ESD event for earlier triggering of said SCR during the ESD event, said second voltage is higher than the ESD transient voltage.

24. The structure of claim 23, wherein said voltage transition means is capable of being powered by the ESD transient voltage.

25. The structure of claim 24, wherein the voltage transition has a ramp rate faster than the ESD transient voltage ramp rate.

26. The structure of claim 23, wherein the second region is electrically coupled to a ESD transient voltage source.

27. The structure of claim 23, wherein the second region is electrically coupled to an IC pad.

28. The structure of claim 23, wherein the second region is electrically coupled to a first bus.

29. The structure of claim 23, wherein the third region electrically couples to a second bus.

30. The structure of claim 28, wherein the first bus is electrically coupled to an ESD transient voltage source.

31. The structure of claim 30, further comprising a diode which connects the first bus and the ESD transient voltage source.

32. The structure of claim 31, wherein the diode is a junction diode of a MOSFET.

33. The structure of claim 28, wherein the first bus is a first power bus.

34. The structure of claim 29, wherein the second bus is a second power bus.

35. The structure of claim 29, wherein the second bus is a ground bus.

36. The structure of claim 29, wherein the base region couples to said second bus.

37. The structure of claim 23, wherein the base region is a substrate of the integrated circuit.

38. The structure of claim 23, wherein the first region is an nwell, the second region is a p+ diffusion, the third region is an n+diffusion, the base region is of p-type.

39. The structure of claim 23, wherein the first region is formed within the base region.

* * * * *